United States Patent
Todoroki et al.

(10) Patent No.: US 7,507,777 B2
(45) Date of Patent: Mar. 24, 2009

(54) PRESS-BONDING ANISOTROPIC CONDUCTIVE RESIN COMPOSITION AND ELASTOMERIC ANISOTROPIC CONDUCTOR

(75) Inventors: Daichi Todoroki, Annaka (JP); Tsutomu Nakamura, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 55 days.

(21) Appl. No.: 11/445,279

(22) Filed: Jun. 2, 2006

(65) Prior Publication Data

US 2006/0276584 A1 Dec. 7, 2006

(30) Foreign Application Priority Data

Jun. 3, 2005 (JP) ............................. 2005-163705

(51) Int. Cl.
*C08L 83/04* (2006.01)
*C08G 77/12* (2006.01)

(52) U.S. Cl. ......................................... 524/588; 528/31

(58) Field of Classification Search .................. 524/588
See application file for complete search history.

(56) References Cited

U.S. PATENT DOCUMENTS

| | | | |
|---|---|---|---|
| 4,740,657 A * | 4/1988 | Tsukagoshi et al. ........ | 174/88 R |
| 5,082,596 A * | 1/1992 | Fukuda et al. .............. | 252/511 |
| 5,352,491 A * | 10/1994 | Cifuentes et al. ........... | 427/387 |
| 5,384,075 A * | 1/1995 | Okami ....................... | 252/511 |
| 5,458,937 A * | 10/1995 | Nakamura et al. ....... | 428/36.91 |
| 5,475,124 A * | 12/1995 | Mazurek et al. ............ | 556/419 |
| 5,882,467 A * | 3/1999 | Sierawski et al. .......... | 156/329 |
| 6,069,201 A * | 5/2000 | Okinoshima et al. ....... | 524/783 |
| 6,361,716 B1 * | 3/2002 | Kleyer et al. ............... | 252/514 |
| 6,414,078 B1 * | 7/2002 | Fukushima et al. ........ | 524/588 |
| 6,433,057 B1 * | 8/2002 | Bhagwagar et al. ........ | 524/403 |
| 6,469,090 B1 * | 10/2002 | Azechi et al. .............. | 524/492 |
| 6,545,267 B1 * | 4/2003 | Miura et al. ................ | 250/251 |
| 6,706,799 B2 * | 3/2004 | Igarashi et al. ............. | 524/495 |
| 6,734,250 B2 * | 5/2004 | Azechi et al. .............. | 524/588 |
| 6,835,331 B2 * | 12/2004 | Fujiki et al. ................ | 252/512 |
| 6,864,315 B1 * | 3/2005 | Hakuta et al. .............. | 525/105 |
| 7,049,375 B2 * | 5/2006 | Meguriya ................... | 525/477 |
| 2002/0187385 A1 * | 12/2002 | Meguriya et al. ............ | 429/36 |
| 2003/0047721 A1 * | 3/2003 | Igarashi et al. ............. | 252/502 |
| 2003/0129347 A1 * | 7/2003 | Yamakawa et al. ........ | 428/40.1 |
| 2003/0190484 A1 * | 10/2003 | Kashiwagi et al. ......... | 428/447 |
| 2004/0041131 A1 * | 3/2004 | Fukushima et al. ........ | 252/500 |
| 2004/0068076 A1 * | 4/2004 | Kozakai et al. ............. | 528/15 |
| 2004/0097640 A1 * | 5/2004 | Meguriya et al. ........... | 524/588 |
| 2004/0122142 A1 * | 6/2004 | Meguriya ................... | 524/268 |
| 2007/0224397 A1 * | 9/2007 | Kawate et al. .............. | 428/200 |

FOREIGN PATENT DOCUMENTS

| JP | 51-135938 A | 11/1976 |
|---|---|---|
| JP | 5-21094 A | 1/1993 |
| JP | 8-7658 A | 1/1996 |
| JP | 10-184962 A | 7/1998 |

* cited by examiner

*Primary Examiner*—Randy Gulakowski
*Assistant Examiner*—Robert Loewe
(74) *Attorney, Agent, or Firm*—Birch, Stewart, Kolasch & Birch, LLP

(57) ABSTRACT

A press-bonding anisotropic conductive resin composition comprising (A) an organopolysiloxane having on the average at least two alkenyl groups per molecule, (B) an adhesion promoter, (C) finely divided silica, (D) metallized conductive particles, and (E) a curing agent becomes an anisotropic conductor by press bonding. The conductive particles accommodate height variations among electrode terminals, allowing the composition to achieve stable interconnects between all electrode terminals.

12 Claims, No Drawings

PRESS-BONDING ANISOTROPIC CONDUCTIVE RESIN COMPOSITION AND ELASTOMERIC ANISOTROPIC CONDUCTOR

CROSS-REFERENCE TO RELATED APPLICATION

This non-provisional application claims priority under 35 U.S.C. §119(a) on Patent Application No. 2005-163705 filed in Japan on Jun. 3, 2005, the entire contents of which are hereby incorporated by reference.

TECHNICAL FIELD

This invention relates to a press-bonding anisotropic conductive resin composition used for mechanical and electrical connection between electrodes on opposed members (e.g., a bare IC chip and an opposed circuit board), and an elastomeric anisotropic conductor.

BACKGROUND ART

With the continuing demand for electronic parts to reduce size and overall profile and improve performance, active efforts are made to develop low-cost high-density packaging technology. For the connection of such microcircuits, conventional solders and rubber connectors are difficult to manage, and instead, anisotropic conductive materials having a good resolving power are often used. With this method, fine electrodes on a liquid crystal display (LCD) module and fine electrodes on a tape automated bonding (TAB) or flexible printed circuit (FPC) substrate are connected by adding an amount of a fine conductive filler to an adhesive resin to form an anisotropic conductive resin composition, interposing the composition between the opposed electrodes and heating under pressure for collectively forming connections between a plurality of electrodes.

From the past, the conductive fillers used in this technology are metal fine powders and organic or inorganic particles which have been metallized by electroplating or the like. The metal fine powders generally have a broad particle size distribution and a problem arises with respect to connection reliability due to influences of conduction, insulation, connection mechanism and the like. As for the conductive particles in the form of metallized plastic particles, conductive particles having a narrow particle size distribution are available, but tend to agglomerate together, offering a reduced contact area and a reduced retaining force for connection between electrodes. It is thus quite difficult to handle microminiaturization by adding conductive particles in a small amount sufficient to avoid agglomeration.

On the other hand, liquid crystal display modules make progress toward further miniaturization and higher reliability. It is thus desired to reduce the conventional electrode pitch of about 200 μm (5 electrodes/mm) to a pitch of up to 100 μm (at least 10 electrodes/mm) while a further resolution improvement will be required in the future. While a rapid progress is made to reduce the size and weight of electronic parts, great efforts are made to utilize anisotropic conductive materials in a packaging technique of directly mounting a bare chip onto a glass substrate, generally known as chip-on-glass (COG), or a packaging technique of directly mounting a bare chip onto a printed board, generally known as chip-on-board (COB). In concert with these efforts, conductive fine particles added to the anisotropic conductive materials are desired to improve the properties that account for the reliability of connection between electrodes.

JP-A 51-135938, JP-A 5-21094, JP-A 8-7658, and JP-A 10-184962 disclose anisotropic conductive adhesive films with high connection reliability using conductive particles obtained by metallizing polymer particles. These adhesive films, however, may fail to achieve satisfactory conduction and bond strength at the same time for connections at fine pitches between opposed circuits.

For the packaging of bare chips using anisotropic conductive resins, a variety of performance factors are required. One factor is connection reliability in fine-circuitry connection. To increase the resolution of the prior art anisotropic conductive resins, engineers attempted to ensure insulation between opposed circuits by using conductive fine particles with a particle size smaller than the insulating portion between the circuits, and adjusting the amount of conductive fine particles added so as to avoid any contact between conductive particles, thereby ensuring conduction to the circuit connections. Regrettably, reducing the particle size of conductive fine particles means that the number of particles and the surface area thereof are substantially increased so that particles undergo secondary agglomeration, with a failure to ensure insulation between opposed circuits. Also, reducing the addition amount of conductive particles means that the number of conductive particles on a circuit to be connected is reduced, resulting in a smaller number of contact points, with a failure to ensure conduction to the circuit connection. It is thus very difficult to increase resolution while maintaining connection reliability.

Another factor is how to overcome the instability of connection due to variations in height of electrodes on a bare chip or IC and variations in height on glass substrate or printed board side. It would be desirable if conductive fine particles accommodate such variations in height to provide stable connections to all terminals.

DISCLOSURE OF THE INVENTION

An object of the present invention is to provide a press-bonding anisotropic conductive resin composition for forming physical and electrical connects between electrodes on opposed members (e.g., a bare IC chip and an opposed circuit board) while keeping a high connection reliability. Another object is to provide an elastomeric anisotropic conductor.

The inventor has found that the above and other objects are attained by using an organopolysiloxane containing on the average at least two alkenyl groups per molecule as a base resin and incorporating metallized conductive particles and an adhesion promoter therein. More specifically, the present invention is characterized by the use of a silicone polymer as the binder in order to enhance the connection stability of the above-mentioned prior art anisotropic conductive materials. By virtue of the excellent properties of the silicone polymer, the resulting anisotropic conductor offers a stable connection resistance over a broad temperature range from low to high temperatures and in a heat shock environment. When hollow particles like glass balloons are used as the core particles of metallized conductive particles, the conductive particles can be collapsed by the pressure applied in forming connections between electrodes, resulting in the anisotropic conductor having an improved retaining force, high resolution, and improved connection reliability.

Accordingly, the present invention provides a press-bonding anisotropic conductive resin composition comprising (A) 100 parts by weight of an organopolysiloxane having on the average at least two alkenyl groups per molecule, (B) 0.1 to 10 parts by weight of an adhesion promoter, (C) 0 to 100 parts by weight of finely divided silica, (D) 0.1 to 10 parts by weight of metallized conductive particles, preferably having an average particle size of 1 to 50 μm and more preferably comprising core particles which are hollow and have a true specific gravity of up to 5, and (E) an effective amount to cure component (A) of a curing agent, the composition becoming an anisotropic conductor by press bonding.

In another aspect, the invention provides an elastomeric anisotropic conductor obtained by press bonding the resin composition between electrodes and heat curing the composition for achieving mechanical and electrical connection between the electrodes.

BENEFITS OF THE INVENTION

The press-bonding anisotropic conductive resin composition of the invention achieves stable interconnects between all electrode terminals because the conductive particles included therein accommodate height variations among the electrode terminals.

DESCRIPTION OF THE PREFERRED EMBODIMENTS

The press-bonding anisotropic conductive resin composition of the present invention comprises (A) an organopolysiloxane, (B) an adhesion promoter, (C) finely divided silica, (D) metallized conductive particles, and (E) a curing agent, which are described in detail.

(A) Organopolysiloxane

The organopolysiloxane (A) is a base component of the composition and should have on the average at least two silicon-bonded alkenyl groups per molecule. Exemplary of the alkenyl groups are those of 2 to 8 carbon atoms, preferably 2 to 4 carbon atoms, such as vinyl, allyl, butenyl, pentenyl, hexenyl, and heptenyl, with vinyl being most preferred. The alkenyl groups may be bonded to silicon atoms at ends and/or side chains of the molecular chain.

In addition to the silicon-bonded alkenyl groups, the organopolysiloxane (A) has organic groups bonded to silicon atoms, for example, unsubstituted or halo-substituted monovalent hydrocarbon groups of 1 to about 12 carbon atoms, preferably 1 to about 10 carbon atoms. Examples include alkyl groups such as methyl, ethyl, propyl, butyl, pentyl, hexyl, cyclohexyl, and heptyl; aryl groups such as phenyl, tolyl, xylyl and naphthyl; aralkyl groups such as benzyl and phenethyl; and haloalkyl groups such as chloromethyl, 3-chloropropyl and 3,3,3-trifluoropropyl; with methyl and phenyl being most preferred.

The content of alkenyl groups in component (A) is preferably of the order of 0.001 to 10 mol %, more preferably 0.01 to 5 mol %, relative to the entire silicon-bonded monovalent organic groups (or substituted or unsubstituted monovalent hydrocarbon groups).

The molecular structure of the organopolysiloxane (A) may be a straight, partially branched straight, cyclic or branched chain, for example. Preferred is a straight chain diorganopolysiloxane whose backbone consists essentially of recurring diorganosiloxane units and whose molecular chain is blocked with a triorganosiloxy group at either end (wherein the organo groups may include alkenyl). The degree of polymerization is specifically 100 to 100,000, more specifically 150 to 20,000.

(B) Adhesion Promoter

The adhesion promoter (B) is effective for enhancing the adhesion to fine electrodes on liquid crystal display (LCD) modules and TAB or FPC substrates. Use may be made of any adhesion promoters which can improve the self-adhesion of the composition. Organosilicon compound-derived adhesion promoters and non-silicon organic compound-derived adhesion promoters are typical. Exemplary organosilicon compound-derived adhesion promoters are adhesion promoters of organosilicon compounds. Exemplary non-silicon organic compound-derived adhesion promoters are adhesion promoters of organic acid allyl esters, epoxy ring-opening catalysts, and organotitanium compounds. These may be used alone or in admixture of two or more.

Examples of the organosilicon compounds include organosilanes, straight or cyclic siloxane oligomers of 3 to 100 silicon atoms, preferably 3 to 50 silicon atoms, more preferably 5 to 20 silicon atoms, (alkoxy)silyl-modified triallylisocyanurates and siloxane derivatives thereof, each of which has functional groups of at least one type selected from the class consisting of alkenyl groups bonded directly to silicon atoms (e.g., vinyl and allyl); epoxy groups bonded to silicon atoms via carbon atoms of alkylene groups or the like (e.g., γ-glycidoxypropyl and β-(3,4-epoxycyclohexyl)ethyl); acryloxy groups bonded to silicon atoms via carbon atoms of alkylene groups or the like (e.g., γ-acryloxypropyl and γ-methacryloxypropyl); alkoxy groups (e.g., methoxy, ethoxy, propoxy, butoxy); alkoxysilyl groups bonded to silicon atoms via alkylene groups which may contain one or two ester, urethane or ether structures (e.g., trimethoxysilyl, triethoxysilyl and methyldimethoxysilyl); isocyanate groups; and SiH groups. Those compounds having functional groups of at least two types per molecule are preferred.

Illustrative, non-limiting examples of the organosilicon compounds are given below.

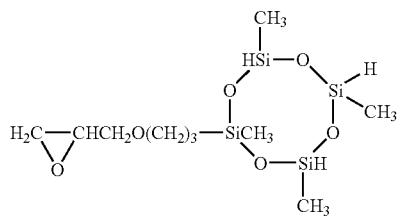 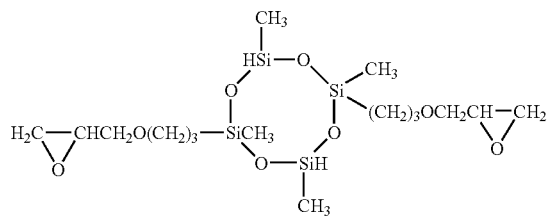

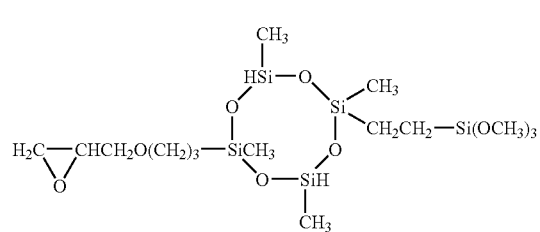
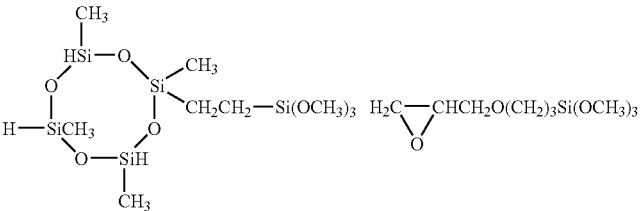
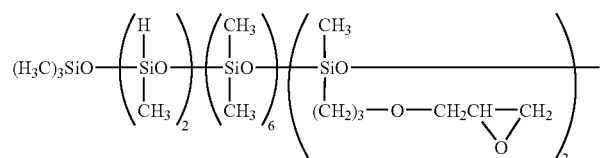
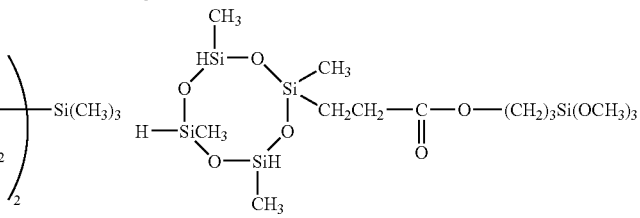
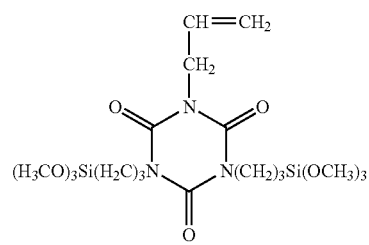
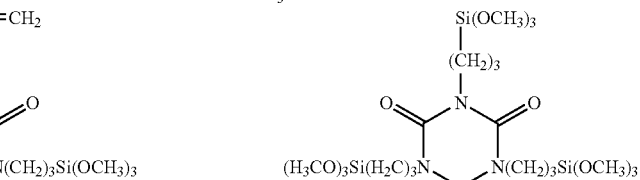

(Letter n is an integer of 1-98.)

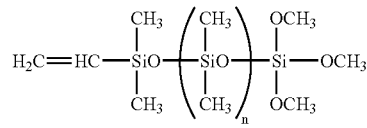
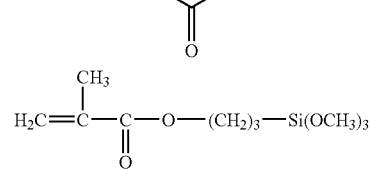
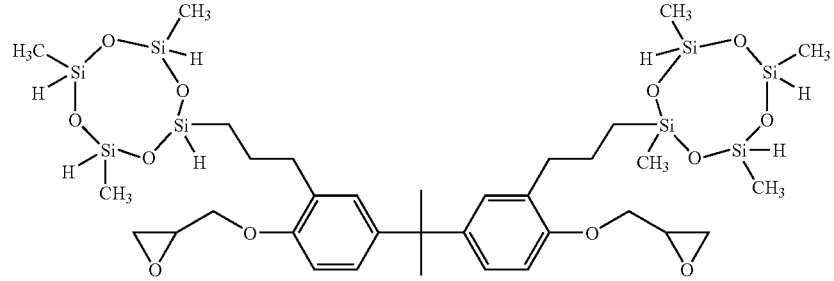

The organotitanium compounds are typically those free of silicon atoms in the molecule. Examples include tetrabutoxytitanium, tetrakis(2-ethylhexyloxy)titanium, tetrastearyloxytitanium, titanium stearate, tetraoctyloxytitanium, titanium isopropoxyoctylene glycolate, triethanolamine titanate, titanium acetylacetonate, titanium ethylacetonate, titanium lactonate, and oligomers and polymers resulting from condensation reaction thereof.

Also useful as the adhesion promoter (B) are organic acid allyl esters having an epoxy equivalent of 100 to 5,000 g/mol, epoxy ring-opening catalysts having an epoxy equivalent of 100 to 5,000 g/mol, organosilicon compounds having an epoxy equivalent of 100 to 5,000 g/mol, organosilicon compounds having an alkenyl group and/or hydrosilyl group and an alkoxy group in the molecule, nitrogen atom-containing organosilicon compounds, and organotitanium compounds having at least 12 carbon atoms, which may be used alone or in admixture.

Examples of the organic acid allyl esters include allyl esters of unsaturated carboxylic acids like acrylic acid, methacrylic acid and vinylacetic acid; allyl esters of aromatic carboxylic acids, such as allyl benzoate, diallyl phthalate, and tetraallyl pyromellitate; and allyl esters of saturated fatty acids, such as allyl acetate, allyl propionate, allyl butyrate, allyl valerate, and allyl laurate. Examples of the epoxy ring-opening catalyst include those free of silicon atoms in the molecule, such as organic metal chelates, amine, amide, imidazole and acid anhydride derivatives.

Examples of the organosilicon compound and the organotitanium compound are as described above.

Also included in component (B) are resinous copolymers composed mainly of $R_3SiO_{1/2}$ units and $SiO_2$ units in a molar ratio $[R_3SiO_{1/2}/SiO_2]$ of from 0.5/1 to 1.5/1, wherein R stands for a substituted or unsubstituted monovalent hydrocarbon group and may or may not contain alkenyl, with the proviso that when R contains alkenyl, the total amount of alkenyl is less than 0.0001 mol/g. Specifically, R stands for substituted or unsubstituted monovalent hydrocarbon groups, preferably having 1 to 10 carbon atoms, more preferably 1 to 8 carbon atoms. Examples of the monovalent hydrocarbon groups represented by R include, but are not limited to, alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; alkenyl groups such as vinyl, allyl, propenyl, isopropenyl, butenyl, hexenyl, cyclohexenyl, and octenyl; and substituted forms of the foregoing in which some or all hydrogen atoms are substituted by halogen atoms (e.g., fluoro, bromo, chloro), cyano groups or the like, such as chloromethyl, chloropropyl, bromoethyl, trifluoropropyl and cyanoethyl.

As the adhesion promoter (B), the foregoing compounds may be used alone or in admixture of two or more.

The amount of component (B) compounded is 0.1 to 10 parts by weight per 100 parts by weight of component (A), through not critical, with the preferred amount being 0.5 to 5 parts by weight. Less than 0.1 pbw of component (B) results in the cured composition not having sufficient bond strength. More than 10 pbw of component (B) detracts from the rubber strength and bond strength of the cured composition and increases the cost, with the composition becoming uneconomical.

(C) Silica

The finely divided silica (C) serves as a reinforcing agent for imparting high tear strength to the cured composition. The finely divided silica should preferably have a specific surface area of at least 50 $m^2/g$, as measured by the BET method, because a rubber coating layer having better tear strength can be formed. The preferred specific surface area is 50 to 400 $m^2/g$, and more preferably 100 to 300 $m^2/g$.

No particular limit is imposed on the finely divided silica as long as the above requirement is met. A choice may be made of well-known silica species which are commonly used as the silicone rubber reinforcing filler. Examples include precipitated silica, fumed silica and fired silica. Such finely divided silica may be used without further treatment. In a preferred embodiment, the silica is surface treated to be hydrophobic prior to use because the use of hydrophobic finely divided silica imparts better flow to the composition. Suitable surface treating agents include silazanes such as hexamethyldisilazane; silane coupling agents such as methyltrimethoxysilane, ethyltrimethoxysilane, propyltrimethoxysilane, butyltrimethoxysilane, dimethyldimethoxysilane, diethyldimethoxysilane, vinyltriethoxysilane, vinyltrimethoxysilane, trimethylmethoxysilane, triethylmethoxysilane, vinyltris(methoxyethoxy)silane, trimethylchlorosilane, dimethyldichlorosilane, divinyldimethoxysilane, and chloropropyltrimethoxysilane; organosilicon compounds such as polymethylsiloxanes and organohydrogenpolysiloxanes.

The finely divided silica species may be used alone or in admixture of two or more.

The amount of finely divided silica compounded is generally 0 to 100 parts by weight per 100 parts by weight of component (A). The preferred amount is 1 to 50 parts by weight and more preferably 1 to 30 parts by weight. Too much amounts of finely divided silica may detract from bond strength.

(D) Conductive Particles

The metallized conductive particles (D) are obtained by starting with core particles such as spherical silica, acrylic resins, glass balloons, silica balloons, phenol balloons, and acrylonitrile balloons, and metallizing the core particles, such as by plating with such metals as Ni, Ag and Au. Alternatively, fine particles of Ni, Ag or the like are plated with gold. The core particles are preferably hollow.

The metal used in the metallized conductive particles is selected from among silver, nickel, gold, copper, tin, zinc, platinum, palladium, iron, tungsten, molybdenum, and alloys thereof, while a multilayer coating of two or more layers of these metals is also acceptable. The coating preferably has a thickness of 0.02 to 0.5 μm.

Examples include Micropearl AU® (Ni and Au-plated resin particles, by Sekisui Chemical Co., Ltd.) and conductive powders as described in JP-A 2004-152660 (Shin-Etsu Chemical Co., Ltd.).

Preferably, the metallized conductive particles have an average particle size of 1 to 50 μm, more preferably 1 to 20 μm. More preferably, the metallized conductive particles based on core particles which are hollow and have a true specific gravity of equal to or less than 5, especially 1 to 3, and an average particle size of 1 to 50 μm, especially 1 to 20 μm are suited for use in fine pitch circuits because insulation from adjacent circuits is assured.

It is noted that the average particle size is a weight average value $D_{50}$ (i.e., particle diameter or median diameter when the cumulative weight amounts to 50%) in particle size distribution measurement by a laser diffraction method.

The metallized conductive particles are added in such amounts that anisotropic conduction is developed when the composition is compressed to a thickness equal to or less than 100 μm. Usually the metallized conductive particles are added in an amount of 0.1 to 10 parts, preferably 0.1 to 5 parts by weight per 100 parts by weight of component (A). Differently stated, the metallized conductive particles are included in the composition in an amount of 0.1 to 30% by volume, especially 0.1 to 10% by volume because this amount prevents the composition from becoming less conductive due to shortage of the conductive particles and from short-circuiting.

(E) Curing Agent

The curing agent (E) may be either an organohydrogenpolysiloxane/platinum group catalyst system (i.e., addition reaction curing agent) or an organic peroxide catalyst, which are both known in the art.

In the former system, any well-known platinum group catalysts may be used. Exemplary catalysts include, but are not limited to, elemental platinum, platinum compounds, platinum composites, chloroplatinic acid, and complexes of chloroplatinic acid with alcohols, aldehydes, ethers and olefins. The platinum group catalyst is preferably added in amounts of 1 to 2,000 ppm of platinum atoms based on the weight of the organopolysiloxane (A).

The organohydrogenpolysiloxane may be straight, branched or cyclic and should preferably have a degree of polymerization of equal to or less than 300. Examples include, but are not limited to, dimethylhydrogensilyl endcapped diorganopolysiloxane, copolymers consisting essentially of dimethylsiloxane units, methylhydrogensiloxane units and terminal trimethylsiloxy units, low viscosity fluids consisting essentially of dimethylhydrogensiloxane (H(CH$_3$)$_2$SiO$_{1/2}$) units and SiO$_2$ units, 1,3,5,7-tetrahydrogen-1,3,5,7-tetramethylcyclotetrasiloxane, 1-propyl-3,5,7-trihydrogen-1,3,5,7-tetramethylcyclotetrasiloxane, and 1,5-dihydrogen-3,7-dihexyl-1,3,5,7-tetramethylcyclotetrasiloxane.

The amount of the organohydrogenpolysiloxane added as the curing agent is such that 50 to 500 mol % of silicon-bonded hydrogen atoms are available relative to the aliphatic unsaturated groups (typically alkenyl groups) in the organopolysiloxane (A).

Suitable organic peroxides include, but are not limited to, benzoyl peroxide, 2,4-dichlorobenzoyl peroxide, p-methylbenzoyl peroxide, 2,4-dicumyl peroxide, 2,5-dimethyl-bis(2,5-t-butylperoxy)hexane, di-t-butyl peroxide, t-butyl perbenzoate, and 1,6-hexanediol bis-t-butylperoxycarbonate. The amount of the organic peroxide used may be 0.1 to 5 parts by weight per 100 parts by weight of the organopolysiloxane (A).

In the inventive resin composition, additives may be added if necessary and as long as they do not compromise the objects of the invention. Suitable additives include extending fillers.

Well-known conductive agents including conductive carbon black and conductive inorganic oxides such as conductive zinc white and conductive titanium oxide may be added along with the metallized conductive particles. Also, fillers such as powdered silicone rubber, red iron oxide, ground quartz, and calcium carbonate known as the extender may be added.

Inorganic or organic blowing agents may also be added to form sponges. Suitable blowing agents include azobisisobutyronitrile, dinitropentamethylenetetramine, benzenesulfonyl hydrazide, and azodicarbonamide. Such blowing agents are preferably added in amounts of 1 to 10 parts by weight per 100 parts by weight of the resin composition. When the blowing agent is added to the inventive composition, sponge silicone rubber can be obtained.

Other suitable additives which can be added to the composition if necessary include colorants, heat resistance improvers, reaction regulators, mold release agents, and dispersants for fillers. Suitable dispersants for fillers include diphenylsilane diol, alkoxysilanes, carbon-functional silanes, and silanol-containing low molecular weight siloxanes while they are added in minimum necessary amounts so as not to compromise the objects of the invention.

When it is desired to render the inventive resin composition flame retardant or fire resistant, well-known additives such as platinum-containing materials, platinum compounds on titanium dioxide, platinum on manganese carbonate, and platinum on $\gamma$-$Fe_2O_3$, ferrite, mica, glass fibers, and glass flakes may be added.

The resin composition of the invention may be prepared by intimately mixing the above-mentioned components on a rubber kneading machine such as a two-roll mill, Banbury mixer, dough mixer or kneader, followed by optional heat treatment. Depending on the viscosity and nature of the organopolysiloxane (A), the composition can preferably be prepared and used in a paste or sheet form.

The press-bonding anisotropic conductive resin composition is used, for example, in forming connections between fine electrodes on a liquid crystal display (LCD) module and a tape automated bonding (TAB) or flexible printed circuit (FPC) substrate, specifically by interposing the composition between plural pairs of opposed electrodes and heating under pressure to collectively form connections between electrodes. The resin composition of the invention is suited especially in a packaging technique of directly mounting a bare chip onto a glass substrate, generally known as chip-on-glass (COG), or a packaging technique of directly mounting a bare chip onto a printed board, generally known as chip-on-board (COB). The invention is advantageously applicable where electrodes are arranged at a pitch equal to or less than 100 µm (including at least 10 electrodes/mm).

The conditions under which the inventive composition is pressure-bonded and heat-cured are suitably selected. The preferred conditions include a temperature of 80 to 250° C., especially 120 to 230° C., a pressure of 0.1 to 10 MPa, especially 1 to 5 MPa, and a time of 5 to 60 seconds, especially 5 to 30 seconds. The distance of press bonding may be equal to or less than 200 µm, especially 1 to 10 µm. Often, the composition is preferably applied to an initial thickness of 1 to 100 µm, especially 10 to 50 µm, and compressed by a proportion of 5 to 95%, especially 20 to 80%.

EXAMPLE

Examples of the invention are given below by way of illustration and not by way of limitation. All parts are by weight.

Example 1

An anisotropic conductive resin composition A was prepared by mixing 100 parts of a dimethylvinylsiloxy end-capped dimethylpolysiloxane having a viscosity of 5,000 mPa-s, 15 parts of hydrophobic silica which had been treated with trimethylsilyl groups and had a specific surface area of 130 $m^2$/g, 5 parts of a dimethylsiloxane-methylhydrogensiloxane copolymer containing silicon-bonded hydrogen atoms at opposite ends and side chains of the molecular chain (silicon-bonded hydrogen atom content: 0.54 wt %) and having a viscosity of 25 mPa-s, 0.05 part of 1-ethynyl cyclohexanol, an amount to give 30 ppm of platinum metal based on the total weight of components (A) and (B) of chloroplatinic acid/divinyltetramethyldisiloxane complex, 1 part of $\gamma$-glycidoxypropyltrimethoxysilane as the adhesion promoter, 2 parts of an organopolysiloxane resin consisting of 39.5 mol % $(CH_3)_3SiO_{1/2}$ units, 6.5 mol % $(CH_3)_2(CH_2\!=\!CH)SiO_{1/2}$ units and 54 mol % $SiO_2$ units, and 1 part (corresponding to 1% by volume of the composition) of silver-plated glass balloons (Ag1085CLD, average particle size 30 µm, specific gravity 1 g/$cm^3$, by Shin-Etsu Chemical Co., Ltd.).

Example 2

Composition B was prepared as in Example 1 except that 3 parts (corresponding to 3% by volume of the composition) of the silver-plated glass balloons was used.

Example 3

Composition C was prepared as in Example 1 except that 3 parts (corresponding to 1% by volume of the composition) of gold-plated resin particles (trade name AUEL003A, average particle size 4 µm, specific gravity 3 g/$cm^3$, by Sekisui Chemical Co., Ltd.) was used instead of the silver-plated glass balloons.

Example 4

Composition D was prepared by mixing 100 parts of an organopolysiloxane consisting of 99.825 mol % dimethylsiloxane units, 0.15 mol % methylvinylsiloxane units and 0.025 mol % dimethylvinylsiloxane units and having an average degree of polymerization of about 6000, 30 parts of hydrophobic fumed silica having a specific surface area of 110 $m^2$/g (Aerosil R-972, by Nippon Aerosil Co., Ltd.), 5 parts of a dimethylsiloxane-methylhydrogensiloxane copolymer containing silicon-bonded hydrogen atoms at opposite ends and side chains of the molecular chain (silicon-bonded hydrogen atom content: 0.54 wt %) and having a viscosity of 25 mPa-s, 1 part of $\gamma$-glycidoxypropyltrimethoxysilane, and 1 part of an organopolysiloxane resin consisting of 39.5 mol % $(CH_3)_3SiO_{1/2}$ units, 6.5 mol % $(CH_3)_2(CH_2\!=\!CH)SiO_{1/2}$ units and 54 mol % $SiO_2$ units, and further mixing with 3 parts (corresponding to 1% by volume of the composition) of gold-plated resin particles (trade name AUEL003A, by Sekisui Chemical Co., Ltd.) and 1.5 parts of 1,6-hexanediol bis-tert-butylperoxycarbonate as the curing agent.

Example 5

Composition E was prepared as in Example 1 except that 3 parts (corresponding to 1% by volume of the composition) of gold-plated silica particles (trade name Au1092, average particle size 10 μm, specific gravity 3 g/cm$^3$, by Shin-Etsu Chemical Co., Ltd.) was used instead of the silver-plated glass balloons.

Comparative Example 1

Composition F was prepared by mixing 100 parts of Epikote 828XA (Japan Epoxy Resins Co., Ltd.), 30 parts of Epikure 113 (Japan Epoxy Resins Co., Ltd.) as the curing agent, 30 parts of hydrophobic fumed silica having a specific surface area of 110 m$^2$/g (Aerosil R-972, by Nippon Aerosil Co., Ltd.), and 3 parts (corresponding to 1% by volume of the composition) of gold-plated resin particles (trade name AUEL003A, by Sekisui Chemical Co., Ltd.).

Test assemblies were formed using the foregoing compositions and evaluated as follows. The results are shown in Table 1.

Test Assembly

Circuit 1 is a FPC having ten gold-plated copper electrodes arranged at a pitch of 200 μm on a polyimide film. Circuit 2 is a circuit having gold-plated copper electrodes of 500 μm wide on a glass-epoxy resin board. Test assemblies were prepared by coating the anisotropic conductive resin composition A, B, C, E or F between circuits 1 and 2 to a width of 3 mm and a thickness of 50 μm, and heat pressing at 180° C. and 3 MPa for 20 seconds for forming interconnects between the circuits. The anisotropic conductive resin composition D was dispensed between circuits 1 and 2 to a width of 3 mm and a thickness of 50 μm, and heat pressed at 180° C. and 3 MPa for 20 seconds for forming interconnects between the circuits. In all the assemblies, the compositions as press-bonded had a thickness of 10 μm or less.

The electrical resistance (in ohm) between circuits 1 and 2 was measured. An average resistance of ten interconnects is reported together with a standard deviation. A reliability test was conducted by thermal cycling between −40° C./30 min and 130° C./30 min. The number of interconnects which were kept sound after 300 cycles is reported.

TABLE 1

|  | Average resistance (Ω) | Standard deviation (Ω) | Number of sound interconnects after 300 cycles |
| --- | --- | --- | --- |
| Example 1 | 0.34 | 0.08 | 10 |
| Example 2 | 0.24 | 0.01 | 10 |
| Example 3 | 0.26 | 0.01 | 10 |
| Example 4 | 0.45 | 0.21 | 10 |
| Example 5 | 0.30 | 0.02 | 10 |
| Comparative Example 1 | 0.37 | 0.13 | 8 |

Japanese Patent Application No. 2005-163705 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A press-bonding anisotropic conductive resin composition comprising
   (A) 100 parts by weight of an organopolysiloxane having on the average at least two alkenyl groups per molecule,
   (B) 0.1 to 10 parts by weight of an adhesion promoter in the form of a resinous copolymer composed mainly of $R_3SiO_{1/2}$ units and $SiO_2$ units in a molar ratio [$R_3SiO_{1/2}/SiO_2$] of from 0.5/1 to 1.5/1, wherein R stands for a substituted or unsubstituted monovalent hydrocarbon group and may or may not contain alkenyl, with the proviso that when R contains alkenyl, the total amount of alkenyl is not more than 0.00092 mol/g,
   (C) 0 to 100 parts by weight of finely divided silica,
   (D) 0.1 to 10 parts by weight of metallized conductive particles comprised of core particles which are plated with one or more metals, the conductive particles having an average particle size of 1 to 50 μm and a true specific gravity of 1 to 5, and
   (E) an addition reaction curing agent consisting of an organohydrogenpolysiloxane in such amount that 50 to 500 mol % of silicon-bonded hydrogen atoms are available relative to alkenyl groups in the organopolysiloxane (A) and a platinum group catalyst in an amount of 1 to 2,000 ppm of platinum atoms based on the weight of the organopolysiloxane (A),
   said composition becoming an anisotropic conductor by press bonding.

2. The resin composition of claim 1 wherein the metallized conductive particles (D) comprise core particles which are hollow.

3. The resin composition of claim 1 which is in paste form.

4. The resin composition of claim 1 which is in sheet form.

5. The resin composition of claim 1 which is used for mechanical and electrical connection between electrodes at a press bonding distance of up to 200 μm.

6. An elastomeric anisotropic conductor obtained by press bonding the resin composition of claim 1 between electrodes and heat curing the composition for achieving mechanical and electrical connection between the electrodes.

7. The resin composition of claim 1 wherein the organopolysiloxane (A) is a straight chain diorganopolysiloxane whose backbone consists essentially of recurring diorganosiloxane units and whose molecular chain is blocked with a triorganosiloxy group at either end.

8. The resin composition of claim 1 wherein the metallized conductive particles (D) are obtained by starting with core particles selected from the group consisting of spherical silica, acrylic resins, glass balloons, silica balloons, phenol balloons, acrylonitrile balloons, and fine particles of Ni or Ag, and metallizing the core particles.

9. The resin composition of claim 8 wherein a metal for metallizing the core particles is selected from the group consisting of silver, nickel, gold, copper, tin, zinc, platinum, palladium, iron, tungsten, molybdenum, and alloys thereof.

10. The resin composition of claim 8 wherein the metallized conductive particles (D) are obtained by starting with the core particles, and metallizing the core particles with a multilayer coating of two or more metals selected from the group consisting of silver, nickel, gold, copper, tin, zinc, platinum, palladium, iron, tungsten, molybdenum, and alloys thereof.

11. The resin composition of claim 1 wherein the metallized conductive particles (D) are obtained by starting with the core particles, and metallizing the core particles with a metal in a thickness of 0.02 to 0.5 μm.

12. The resin composition of claim 1 which additionally contains an adhesion promoter selected from the group consisting of organic acid allyl esters, epoxy ring-opening catalysts, organosilicon compounds having an epoxy equivalent of 100 to 5,000 g/mol, organosilicon compounds having an alkenyl group and/or hydrosilyl group and an alkoxy group in the molecule, nitrogen atom-containing organosilicon compounds, and organotitanium compounds.

* * * * *